(12) United States Patent
Isomura

(10) Patent No.: US 7,109,761 B2
(45) Date of Patent: Sep. 19, 2006

(54) COMPARATOR CIRCUIT

(75) Inventor: Hirofumi Isomura, Kariya (JP)

(73) Assignee: Denso Corporation, Kariya (JP)

( * ) Notice: Subject to any disclaimer, the term of this patent is extended or adjusted under 35 U.S.C. 154(b) by 29 days.

(21) Appl. No.: 11/059,389

(22) Filed: Feb. 17, 2005

(65) Prior Publication Data

US 2005/0184761 A1    Aug. 25, 2005

(30) Foreign Application Priority Data

Feb. 25, 2004   (JP) .............................. 2004-049548

(51) Int. Cl.
*H03K 5/22* (2006.01)
(52) U.S. Cl. ........................................ 327/77; 327/321
(58) Field of Classification Search ............ 327/77–79, 327/81, 87, 89, 321, 328
See application file for complete search history.

(56) References Cited

U.S. PATENT DOCUMENTS 5,696,400 A    12/1997  Yoshida et al. ............. 257/392
6,011,414 A *   1/2000  Majid et al. ................... 327/95
6,600,639 B1*   7/2003  Teo et al. ....................... 361/92
6,703,813 B1*   3/2004  Vladislav et al. ........... 323/270
6,894,542 B1*   5/2005  Prexl et al. .................... 327/67

* cited by examiner

*Primary Examiner*—My-Trang Nu Ton
(74) *Attorney, Agent, or Firm*—Posz Law Group, PLC

(57) ABSTRACT

A reference voltage and an input signal voltage are applied to gates of FETs each equipped with a LOCOS-drain structure, respectively, and currents according to the voltages are made to flow from a power supply voltage Vbat to drain sides through resistors and sources, respectively. The currents are made to flow in FETs to be converted to voltages. Then, both voltages are compared in a comparator. When a potential of a reference voltage input terminal in the comparator that operates with power provided by a power supply Vcc tends to rise above a predetermined level, a FET is turned on and clamps the voltage so as to suppress its potential rise.

6 Claims, 4 Drawing Sheets

COMPARATOR CIRCUIT

CROSS REFERENCE TO RELATED APPLICATION

This application is based on and incorporates herein by reference Japanese Patent Application No. 2004-49548 filed on Feb. 25, 2004.

FIELD OF THE INVENTION

This invention relates to a comparator circuit having MOSFETs of a LOCOS-drain structure formed on a P-type silicon substrate.

For increasing a withstand voltage between a source and a drain of a MOSFET, a LOCOS-drain structure is used as disclosed in U.S. Pat. No. 5,696,400 (Japanese Patent No. 2981717 and No. 3041354). According to this MOSFET, it becomes possible to allow a large current value per unit channel.

FIG. 7 shows schematically a cross section of an N-channel MOSFET 1 having the normal LOCOS-drain structure. This FET 1 is constructed by forming a P-type concentration adjustment region 3 and a drain region 4 on a P-type substrate 2 and forming contact regions 5 and 6 in respective regions. Then a LOCOS oxide film 7 and a gate oxide film are formed on the drain side, and a gate electrode 8 is formed thereon.

FIG. 8 shows schematically a cross section of a P-channel MOSFET 9 having the normal LOCOS-drain structure similar to FIG. 7. This FET 9 is constructed by forming an N-well 11 on a P-type silicon substrate 10, forming a drain region 12 in the N-well 11, and further forming a contact region 13 of a source in the N-well 11 and a contract region 14 of a drain in the drain region 12. Then, a LOCOS oxide film 15 and a gate oxide film are formed on the drain side, and a gate electrode 16 is formed on them.

However, in the above FETs having the LOCOS-drain structure, an insulating film disposed between the source and the gate is relatively thin, as shown in FIG. 7 and FIG. 8. For example, in the case where this FET is used to construct a circuit whose potential difference between the source and the gate varies largely, such as a comparator, the gate insulating film of the MOSFET needs to be made thick. For this reason, in the case of constructing a comparator, a required withstand voltage may not be provided by only using MOSFETs which simply have the LOCOS-drain structure.

SUMMARY OF THE INVENTION

The object of this invention is therefore to provide a comparator circuit, in which a withstand voltage can be ensured sufficiently and a range of an input voltage to be compared can be set wide.

According to a comparator circuit of this invention, a reference voltage and an input signal voltage are applied to gates of first and second FETs, respectively, and currents according to respective voltages flow from a first power supply to respective drains through respective resistance elements and sources. The currents flow into the ground through a current mirror circuit. In this case, since the current mirror circuit forms an active load, the currents flowing into the circuit are converted into voltages and both voltages are compared in a comparison operation unit. Here, for the first and second FETs in which the upper limit of the application voltage serves as a first power supply voltage, MOSFETs having the LOCOS-drain structure are used.

When a potential of a reference voltage input terminal tends to rise above a predetermined level in the comparison operation unit that operates by being supplied with a second power supply whose voltage is lower than the first power supply voltage, a voltage clamp circuit clamps the voltage so as to suppress its potential rise. Therefore, in the structure where the operating power supply voltage of the comparison operation unit becomes lower than the maximum in the input voltage range, the comparison operation unit can be prevented from coming to breakdown due to application of an excessive voltage to its input terminal.

Moreover, the comparator circuit can compare the input voltage without dividing it with resistors, and hence it is suitable for comparing a voltage signal that is outputted from the comparator circuit with high output impedance, and a signal that is likely to become lower in level by being transmitted for a relatively long distance, such as a communication signal, and for performing similar operations.

Preferably, the comparator circuit varies the reference voltage in response to a variation in the level of an output signal of the comparison operation unit by bypassing a resistance element that is connected nearer the ground than the reference voltage setting point of the series resistor circuit. That is, when the output signal of the comparison operation unit changes from low to high or from high to low, the reference voltage that is determined by divided voltage of the series resistor circuit will vary. Therefore, a hysteresis characteristic can be endowed to a comparison operation as the comparator circuit.

Preferably, the reference voltage varying part is constructed of a MOSFET of the LOCOS-drain structure, whereby the withstand voltage against application of the first power supply voltage can be ensured.

Preferably, in the case where a reference voltage is directly applied from the outside, a plurality of series resistance elements are connected between the first power supply and sources of the first and second FETs. The comparator circuit varies the threshold voltage in the comparison operation unit in response to a variation in the level of a signal outputted from the comparison operation unit by bypassing one or more of series resistance elements connected to the source side, providing an alternative path to the first power supply side. That is, when the resistance value of the source side of the first FET is changed, the value of a current flowing between the source and drain of the first FET will change, and so a potential of the reference voltage input terminal in the comparison operation unit will change. Therefore, even in the structure in which the reference voltage is given from the outside, the threshold voltage in the comparison operation unit can be changed and consequently a hysteresis characteristic can be endowed to the comparison operation as the comparator circuit. Since the reference voltage is not divided by resistors, the comparator circuit is suitable for comparing a voltage signal outputted by, for example, a sensor equipped with a bridge circuit.

Preferably, when the output signal level in the comparison operation unit changes, an ON or OFF state of an FET will change, and according to its ON/OFF state, an ON or OFF state of the P-channel FET will change. Consequently, a bypassing state of the source-side series resistance elements in the first FET changes. Therefore, the comparator circuit can vary the threshold voltage in the comparison operation unit in response to a variation in the level of a signal outputted from the comparison operation unit.

Preferably, the voltage clamp circuit comprises an N-channel MOSFET connected between the reference voltage input terminal and the comparison voltage input terminal. That is, when the input voltage to be compared, namely, the gate potential of the second FET rises to a predetermined level, the second FET is turned off from the ON state. When the second FET is turned off, a current flowing in one element of the current mirror pair will be cut off. This causes a current flowing in the other element forming the current mirror pair to decrease. However, because the first FET aims to make a current flow in the other element of the pair, the potential of the reference voltage input terminal in the comparison operation unit will rise.

At this time, in the N-channel MOSFET acting as voltage clamping part, due to the gate potential rising with respect to the source potential, the FET clamps the voltage by changing from OFF to ON. Therefore, the comparator circuit can suppress the potential rise at the reference voltage input terminal and prevent the cut-off of the current flowing in the one element of the mirror pair.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF THE PREFERRED EMBODIMENTS

First Embodiment

Figure 1:
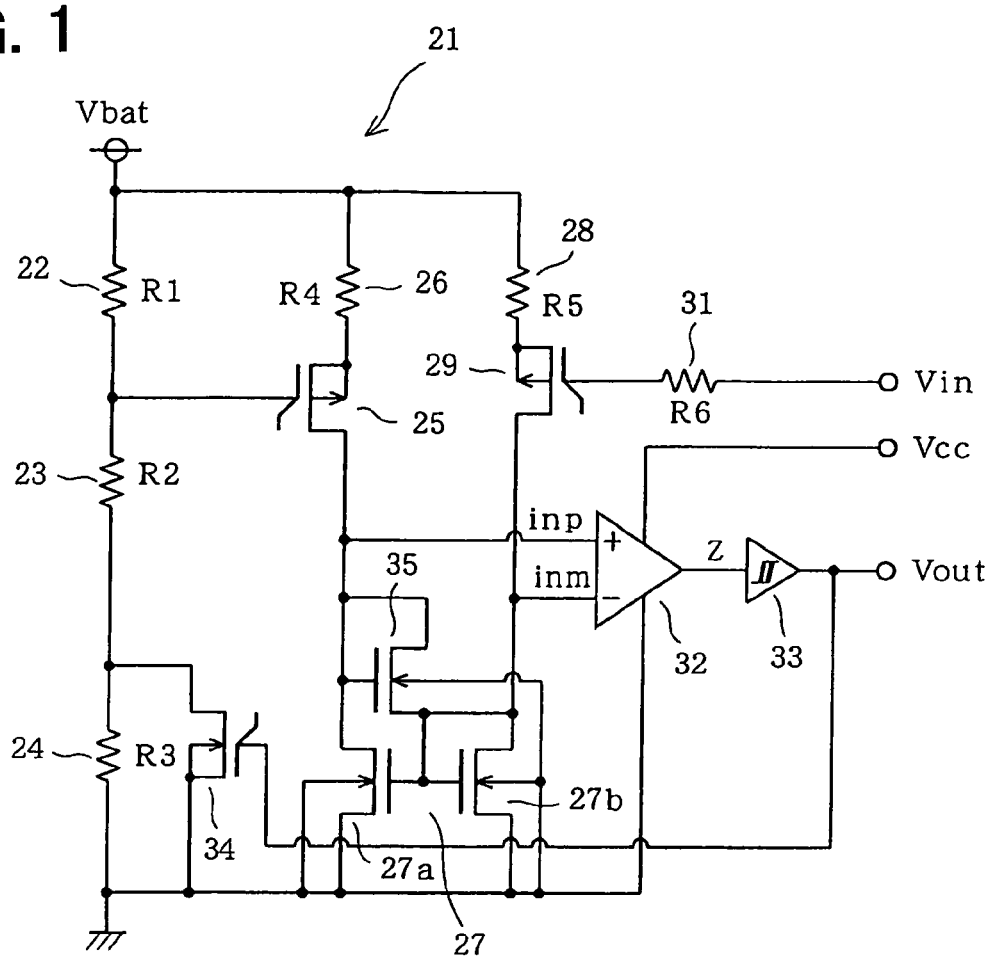
FIG. 1 is a circuit diagram showing a comparator circuit with a hysteresis characteristic according to a first embodiment in the case where the comparator circuit is applied to an electronic circuit, such as a vehicle-mounted ECU.

A comparator circuit 21 with a hysteresis characteristic is shown in FIG. 1, in which a FET of the LOCOS-drain structure is shown by a symbol of a FET with a part of the gate slanted toward the drain side. This comparator circuit 21 is used in an electronic control unit (ECU) for a vehicle.

Figure 7:
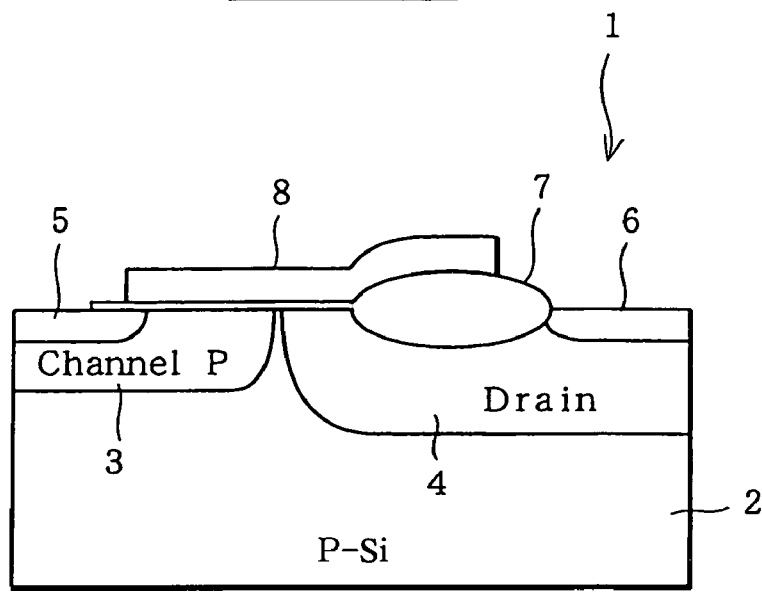
FIG. 7 is a schematic sectional view of an N-channel MOSFET having the normal LOCOS-drain structure.
Figure 8:
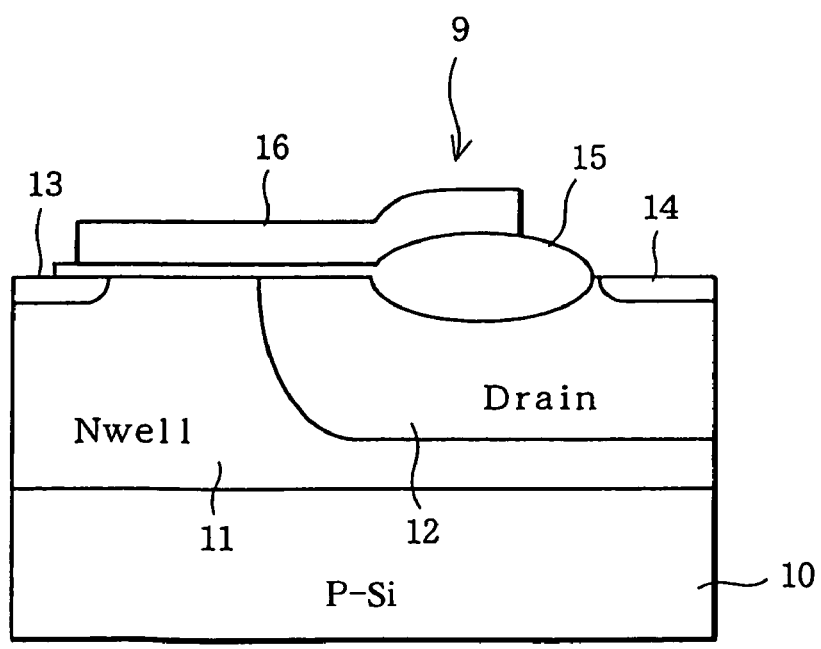
FIG. 8 is a schematic sectional view of a P-channel MOSFET.

The comparator circuit 21 has a series circuit of resistors 22, 23 and 24. This series circuit is connected between a battery power supply voltage Vbat (first power supply) and the ground. The gate of a P-channel MOSFET 25 (first P-channel MOSFET) is connected to a common junction point of the resistors 22 and 23. The source of the FET 25 is connected to the power supply voltage Vbat through a resistor 26. The drain of the FET 25 is connected to the ground through the drain and the source of an N-channel MOSFET 27a. The FET equipped with the LOCOS-drain structure is of almost identical structure with those shown in FIG. 7 and FIG. 8.

Between the power supply voltage Vbat and the ground, a resistor 28, a P-channel MOSFET 29 (second P-channel MOSFET) of the LOCOS-drain structure, and an N-channel MOSFET 27b are connected in symmetry with the resistor 26 and the FETs 25 and 27a. The gate of the FET 29 is connected to an input terminal Vin (same notation as input voltage Vin) through a resistor 31. Gates of the FETs 27a and 27b are connected to the drain of the FET 27b in common, forming a current mirror circuit 27. Resistance values of the resistors 26 and 28 are set to the same value.

The drains of FETs 25 and 29 are connected to the non-inverting input terminal (inp) and the inverting input terminal (inm) of a comparator (comparison operation unit) 32, respectively. An output terminal of the comparator 32 is connected to an output terminal Vout (same notation as output voltage Vout) through a Schmidt-trigger buffer 33. The comparator 32 is constructed so as to operate with a power supply Vcc for operation (for example, 5V, second power supply) of a control circuit (not shown) that performs signal processing of the output voltage Vout. The buffer 33 is interposed in order to prevent chattering or jittering of the comparator 32.

The drain and the source of an N-channel MOSFET 34 of the LOCOS-drain structure for varying a reference voltage are connected to both ends of the resistor 24, respectively. The gate of the FET 34 is connected to the output terminal of the buffer 33. The drain and the gate of an N-channel MOSFET 35 for clamping a voltage are connected to the drain of the FET 25, and its source is connected to the drain of the FET 29 and the gates of the FETs 27a and 27b. The back gate of the FET 35 is connected to the ground.

Next, the operation of this embodiment will be described referring to FIG. 2. A voltage signal that is in the range of the ground level to the power supply voltage Vbat is inputted to the input terminal Vin. The comparator circuit 21 is structured so as to compare a voltage applied to its input terminal Vin with a reference voltage applied to the gate of the FET 25. A gate potential of the FET 25, namely, the reference potential is switched over according to ON/OFF of the FET 34. A reference potential Vp1 (the high side threshold) in the case where the FET 34 is OFF is expressed as follows.

$$Vp1 = Vbat \times (R2+R3)/(R1+R2+R3) \quad (1)$$

In the case where the FET 34 is ON, the resistor 24 is short-circuited, and thus the reference voltage Vn1 (low-side threshold) is expressed as follows.

$$Vn1 = Vbat \times R2/(R1+R2) \quad (2)$$

Thus, a relationship of Vp1>Vn1 holds.

[Case 1: Vin Changes from GND to Vbat]

Figure 2:
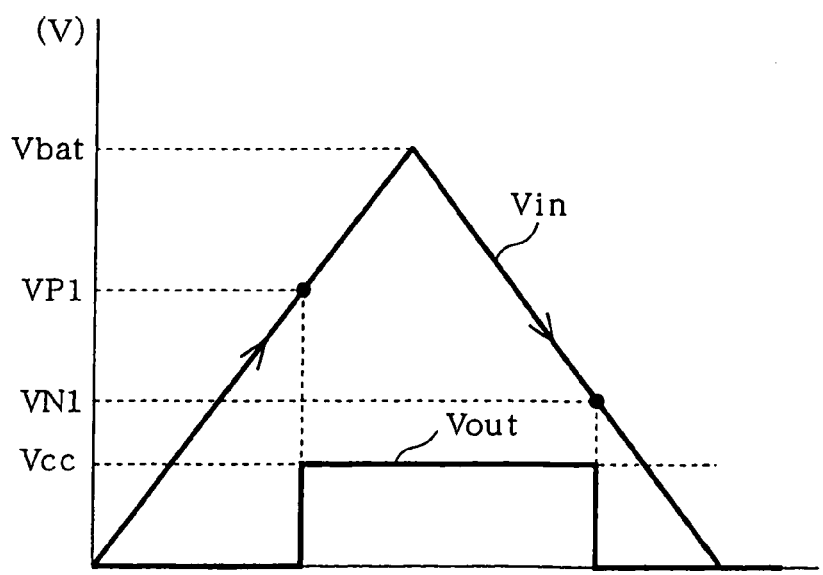
FIG. 2 is a characteristic diagram showing a variation in an output voltage of the comparator circuit shown in FIG. 1 in response to a variation in an input voltage.

FIG. 2 shows a variation in output voltage Vout of the comparator circuit 21 in response to a variation in the input voltage Vin. When the input voltage Vin is the ground level, the FET 29 is ON, and its source potential is equal to a potential of the input terminal Vin plus a threshold voltage Vthp of the FET 29. Therefore, representing a resistance value of the resistor 28 by R5, the following current I1 flows in the resistor 28.

$$I1 = (Vbat - Vin + Vthp)/R5 \quad (3)$$

This current I1 flows in the FET 27*b* and is converted to a voltage thereby, which sets a potential of the inverting input terminal of the comparator 32.

At this time, since the potential of the inverting input terminal of the comparator 32 is high, the output voltage of the buffer 33 is the ground level, the FET 34 is OFF, and the gate potential of the FET 25 is the reference potential Vp1. Therefore, a source potential of the FET 25 becomes (Vp1+Vthp), and the following current I2 flows in the resistor 26.

$$I2=(Vbat-Vp1+Vthp)/R5 \qquad (4)$$

This current I2 flows in the FET 27*a* and is converted to a voltage thereby, which sets a potential of the inverting input terminal of the comparator 32. That is, the source potentials of the FETs 25 and 28 vary as in the case where the source follower connection is established.

In the above case, the output voltage Vout of the comparator circuit 21 is equal to the ground level. Moreover, since the potential of the inverting input terminal of the comparator 32 is higher, the FET 35 is OFF.

When the input voltage Vin rises and exceeds Vp1 (Vin>Vp1), the output voltage Vout of the comparator circuit 21 shifts to Vcc level from the ground level. Then, the FET 34 is turned on and a reference voltage changes to Vn1. When the input voltage Vin further rises to Vin>Vbat−Vthp, the FET 29 is turned off and the current no longer flows into the resistor 28.

At this time, the current flowing into the FET 27*b* also decreases. However, in the FET 27*a* forming a current mirror pair, a current flows thereinto through the FET 25, and a potential of the inverting input terminal of the comparator 32 rises. Since the FET 35 is turned on and supplies a current also to the FET 27*b*, the comparator circuit 21 can clamp the potential of the non-inverting input terminal so that it does not rise above Vcc. At the same time, this operation avoids cut-off of the FET 27*b*. In addition, a potential of the inverting input terminal is also suppressed not to rise above Vcc by an internal structure or operation of the comparator 32. The details of the comparator 32 is shown in FIG. 3.

[Case 2: Vin Changes from Vbat to GND]

When the input voltage Vin decreases to be less than Vn1 (Vin<Vn1), magnitudes of the currents I1 and I2 flowing in the resistors 26 and 28, respectively, will be reversed. This causes magnitudes of the potentials at the two input terminals of the comparator 32 to be reversed. The output voltage Vout of the comparator circuit 21 shifts to the ground level from the Vcc level, and the FET 34 is turned off, whereby the reference voltage returns to Vp1 again. Moreover, when a potential difference between the inverting input terminal and the non-inverting input terminal of the comparator 32 becomes equal to or less than the threshold voltage, the FET 35 is turned off.

Figure 3:
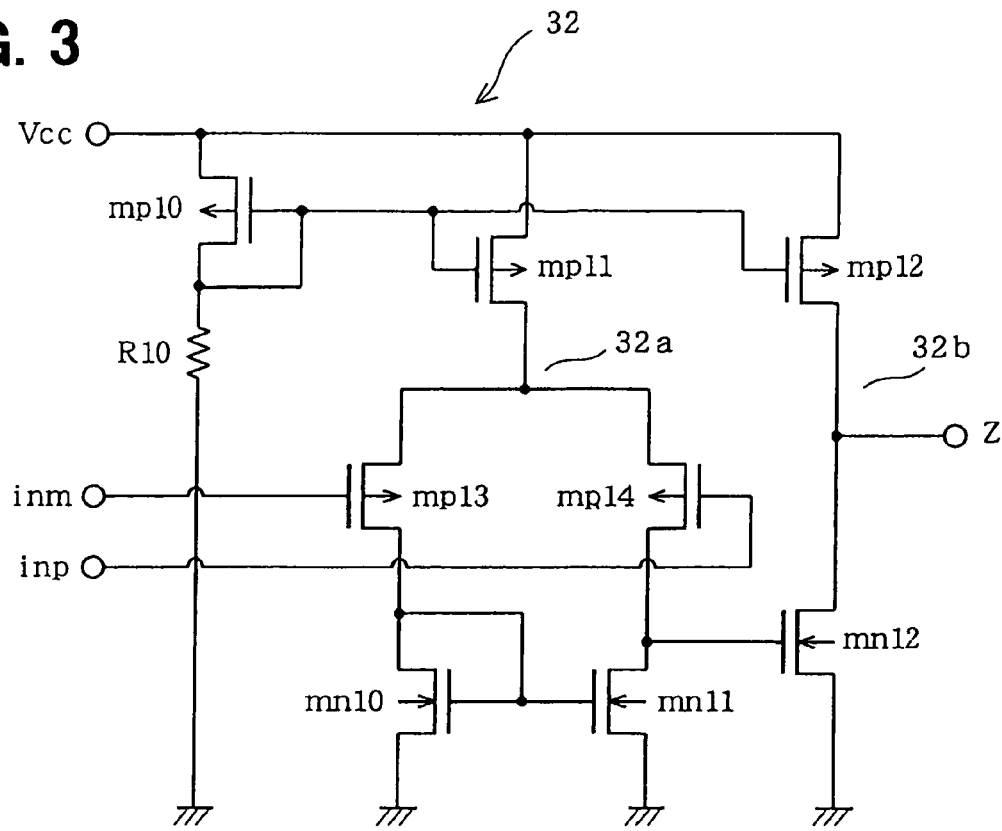
FIG. 3 is a circuit diagram showing an internal circuit structure of the comparator shown in FIG. 1.

Here, as shown in FIG. 3, the internal structure of the comparator 32, does not differ so much from that of the normal comparator. That is, the comparator 32 has a differential amplifier circuit unit 32*a* and an amplifier unit 32*b*. The differential amplifier circuit unit 32*a* includes N-channel MOSFETs mn10 and mn11, and P-channel MOSFETs mp11, mp13, and mp14 that are connected between the power supply Vcc and the ground.

The amplifier unit 32*b* includes a P-channel MOSFET mp12 and an N-channel MOSFET mn12 that are connected between the power supply Vcc and the ground. The gate of a P-channel MOSFET mp10 forming a current mirror pair is connected to gates of the FET mp11 and the FET mp12 in common. The source of the FET mp10 is connected to the power supply Vcc and its drain is connected to the ground through a resistor R10 for setting a constant current. The FET mp10 and the resistor R10 are common parts of the differential amplifier circuit unit 32*a* and the amplifier unit 32*b*.

The gates of the FETs mp13 and mp14 are connected to the non-inverting input terminal and the inverting input terminal, respectively. The FETs mn10 and mn11 forming a current mirror circuit operate as a load circuit (active load) of the FETs mp13 and mp14. A common junction point (drain) of the FETs mn12 and mp12 is the output terminal Z of the comparator 32.

Figure 4:
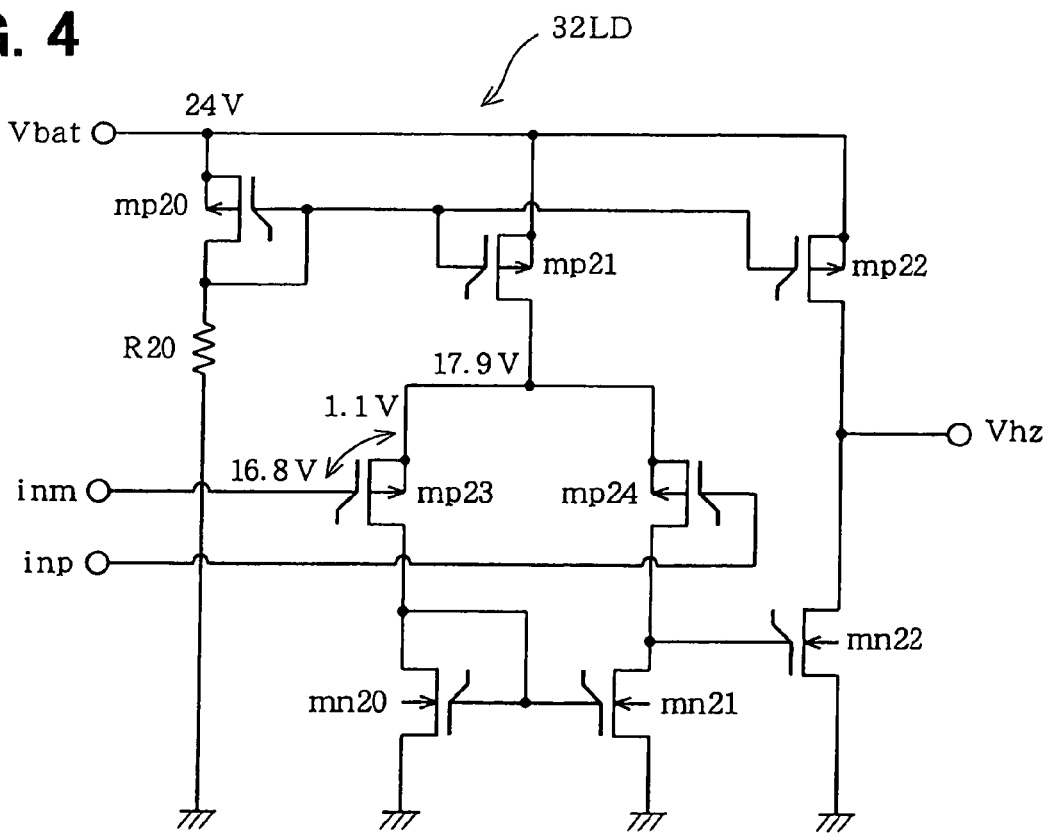
FIG. 4 is a circuit diagram showing a comparator circuit in which all the FETs of the comparator shown in FIG. 3 are replaced with FETs of the LOCOS-drain structure.

FIG. 4 shows a comparator 32LD constructed in such a way that all the FETs forming the comparator 32 are replaced with FETs of the LOCOS-drain structure for comparison purposes. In this figure, any reference numerals of ten and over representing the circuit elements in FIG. 3 are replaced with the reference numerals of twenty and over.

Here, in vehicle application, it is assumed that, if an engine is difficult to start under low temperature environments in, for example, cold districts etc., a jumper start is tried. The jumper start is a method in which another 12-V battery is connected to a 12-V battery in series so that 24-V is applied to a starter motor to start the engine. Therefore, as an ECU mounted on the vehicle must stand application of excessive voltage of at least 24V.

In this connection, the case where Vbat becomes 24 V in the comparator 32LD shown in FIG. 4 will be examined. At this time, it is assumed that the reference voltage set up at the non-inverting input terminal becomes 70% of 24 V, namely, 24 V×0.7=16.8V, and the input voltage Vin of the inverting input terminal becomes 0 V. Then, a drain potential of an FET mp21 becomes 17.9 V that is the reference voltage 16.8 V plus the threshold voltage Vthp=1.1 V, generating a large potential difference between the source and the gate of an FET mp24.

Generally, in order to secure reliability of FETs in consideration of TDDB (time dependence dielectric breakdown: time dependency of insulation film breakdown), it is necessary to suppress the permissible voltage input to about 3 MV/cm. For example, for the FETs used in this embodiment, in order to suppress the permissible voltage input to 3 MV/cm or less with a gate insulation film of a film thickness of 380 Angstroms (38 nm), it is necessary to suppress the source-gate voltage to be 11.4 V or less. Therefore, a comparator that is constructed only by replacing the FETs of the conventional comparator with FETs of the LOCOS-drain structure, as shown in FIG. 4, is not guaranteed to withstand an excessive voltage assumed at the time of jumper start.

Unlike this, with the comparator circuit 21 of this embodiment, in the case where the input voltage Vin decreased by some amount, excessive rise in the input terminal potential of the comparator 32 is avoided because it turns on the FET 35 and clamps the voltage. Therefore, it becomes unnecessary for the comparator 32 to be constructed especially using FETs of the LOCOS-drain structure.

As described above, according to the first embodiment, the comparator circuit 32 is structured as follows. The reference voltage and the input signal voltage are applied to the gates of the FETs 25 and 29 each equipped with the LOCOS-drain structure. Currents in response to these voltages are made to flow to the drains from the power supply voltage Vbat through the resistors 26, 28 and their sources, respectively. The currents are converted to voltages by making them flow in the FETs 27*a* and 27*b* forming the current mirror circuit 27, respectively. Both voltages are compared in the comparator 32.

Moreover, when the potential of the reference voltage input terminal tends to rise above the predetermined level in the comparator 32 that operates with the power supply Vcc being supplied, the FET 35 is turned on and clamps the voltage to suppress the potential rise. Therefore, breakdown due to application of an excessive voltage to the input terminal of the comparator 32 can be prevented.

Furthermore, with the comparator circuit 21, since it can compare the input voltage without dividing it with resistors, it is suitable for comparing a voltage signal that is outputted from a circuit apparatus with high output impedance and a signal that is likely to decrease in level by being transmitted for a relatively long distance, such as a communication signal, and for performing similar operations.

Further, in response to a variation in the level of a signal outputted from the comparator 32, the reference voltage is changed by bypassing the resistor 24 connected nearer or closer to the ground than the gate of the FET 25 using the FET 34. Thus, a hysteresis characteristic can be endowed to the comparison operation as the comparator circuit 21. Moreover, since the FET 34 is constructed using the LOCOS-drain structure, the withstand voltage against the application of the power supply voltage Vbat can be ensured.

Second Embodiment

Figure 5:
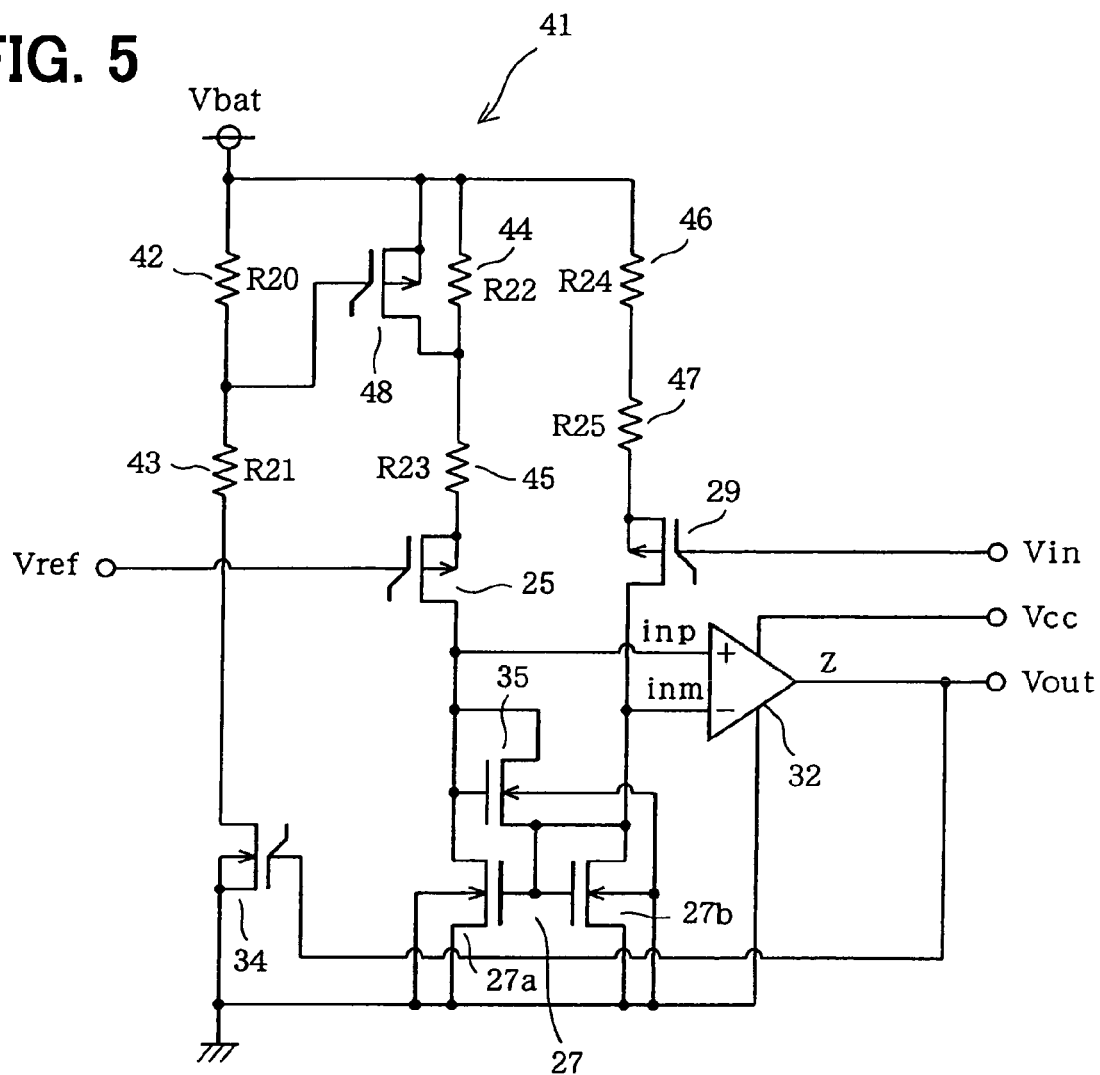
FIG. 5 is a circuit diagram of a comparator circuit with a hysteresis characteristic according to a second embodiment of this invention.
Figure 6:
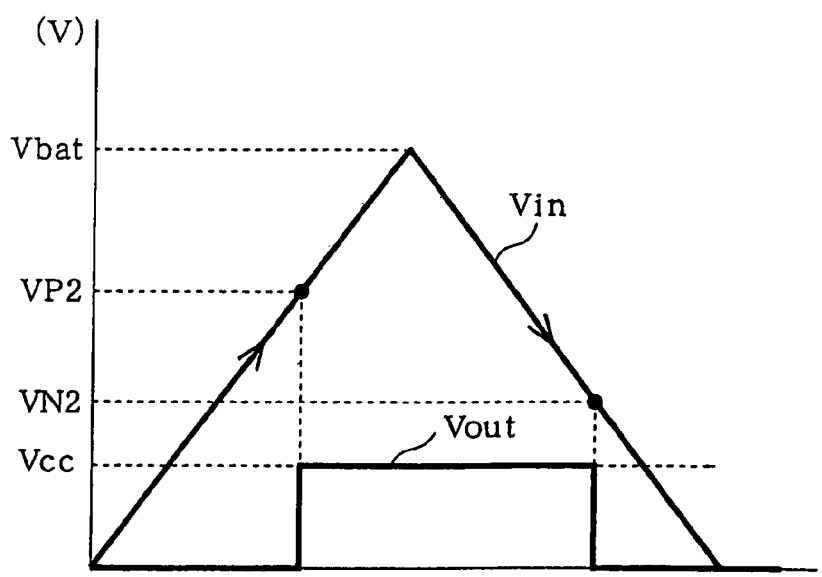
FIG. 6 is a characteristic diagram showing a variation in an output voltage of the comparator circuit shown in FIG. 5.

In FIG. 5 and FIG. 6 showing a second embodiment of this invention, the same parts as those of the first embodiment are designated by the same reference numerals. A comparator circuit 41 has a series circuit of resistors 42, 43 and the FET 34. The gate of the FET 34 for varying the threshold voltage is connected to the output terminal of the comparator 32.

Between the sources of the FETs 25 and 29 and the power supply voltage Vbat, a series circuit of resistors 44 and 45 and a series circuit of resistors 46 and 47 are connected, respectively. To both ends of the resistor 44, the source and the drain of a P-channel MOSFET of the LOCOS-drain structure (threshold voltage varying means) 48 are connected. The gate of the FET 48 is connected to the common junction point of the resistors 42 and 43. The FET 29 is connected to receive the input voltage Vin without a resistor, and the gate of the FET 25 is connected to receive a reference voltage Vref from the outside.

Next, the operation of the second embodiment will be described referring to FIG. 6. The comparator circuit 41 compares a voltage applied to its input terminal Vin with the reference voltage Vref applied to the gate of the FET 25. The potential applied to the non-inverting input terminal of the comparator 32 is changed over according to ON/OFF of the FET 48, taking either a high-side threshold Vp2 and a low-side threshold Vn2.

That is, when the output voltage of the comparator 32 is at the ground level, the FET 34 is OFF, and consequently a gate potential of the FET 48 is the power supply voltage Vbat. Therefore, the FET 48 will be turned OFF.

At this time, representing currents flowing in the resistors 45 and 47 by I1 and I2, they are expressed by the following equations (5) and (6), receptively. Here, the resistances of the resistors 44–47 are represented by R22–R25, respectively. These resistance values are in a relation of (R22+R23=R24+R25).

$$I1=(Vbat-Vref+Vthp)/(R22+R23) \quad (5)$$

$$I2=(Vbat-Vin+Vthp)/(R24+R25) \quad (6)$$

When the input voltage Vin becomes equal to the high-side threshold Vp2, the current I1 becomes I1=I2. Therefore, the following equation holds.

$$(Vbat-Vref+Vthp)/(R22+R23)=(Vbat-Vp2+Vthp)/(R24+R25) \quad (7)$$

From the equation (7), Vp2 is obtained as follows.

$$Vp2=Vbat+Vthp-[(R24+R25)\times\{(Vbat-Vref+Vthp)/(R22+R23)\}] \quad (8)$$

That is, when the output voltage of the comparator 32 is equal to the Vcc level, the FET 34 is ON. Thus, the gate potential of the FET 48 will decrease from the power supply voltage Vbat by the voltage drop in the resistor 42, which causes the FET 48 to be turned on. Then, the resistor 44 will be short-circuited.

At this time, the current I1 flowing in the register 45 is expressed as follows.

$$I1=(Vbat-Vref+Vthp)/R23 \quad (9)$$

When the input voltage Vin becomes equal to the low-side threshold Vn2, the current I1 becomes I1=I2, which brings the following equation.

$$(Vbat-Vref+Vthp)/R23=(Vbat-Vp2+Vthp)/(R24+R25) \quad (10)$$

From the equation (11), Vn2 is obtained as follows.

$$Vn2=Vbat+Vthp-[(R24+R25)\times(Vbat-Vref+Vthp)/R2] \quad (11)$$

[Case 3: Vin Changes from GND to Vbat]

FIG. 6 shows a variation in the output voltage Vout of the comparator circuit 41 in response to a variation in the input voltage Vin. When the input voltage is at the ground level, the FETs 34 and 48 are OFF. In this state, when the input voltage Vin exceeds the high-side threshold Vp2 (Vin>Vp2), the output voltage of the comparator 32 shifts to the Vcc level, which causes the FETs 34 and 48 to be turned on. Then, the current I1 flowing in the resistor 23 varies from a value determined by the equation (5) to a value determined by the equation (9), and the threshold voltage changes to the low-side threshold Vn2.

Moreover, when the input voltage Vin becomes Vin>Vbat−Vthp in the above process, the FET 35 is turned on in the same way as the first embodiment, and clamps the voltage.

[Case 4: Vin Changes from Vbat to GND]

When the input voltage is lowered to be Vin<Vn2, the current I1 flowing in the resistor 23 changes from a value determined by the equation (9) to a value determined by the equation (5), and threshold voltage returns to the high-side threshold Vp2 from the low-side threshold Vn2. Moreover, in that process, as in the first embodiment, when the potential difference between the inverting input terminal and the non-inverting input terminal of the comparator 32 becomes within the threshold voltage, the FET 35 is turned off.

According to the second embodiment, the comparator circuit 41 is specified to take a structure in which the reference voltage Vref is applied from the outside instead of performing the voltage division with resistors. Then, the FETs 34 and 48 bypass the resistor 44 connected to the source of the FET 25, providing an alternative path to the power supply voltage Vbat, in response to a variation in the level of a signal outputted from the comparator 32, whereby the threshold voltage of the comparator is changed. Therefore, even in the structure in which the reference voltage is given from the outside, a hysteresis characteristic can be endowed to the comparison operation as the comparator circuit by changing the threshold voltage in the comparator 32.

Here, pressure sensors, magnetic sensors, etc. that are used often, for example, as vehicle-mounted sensors are mostly equipped with a resistance bridge circuit. They are constructed with relatively high impedance. Therefore, if the comparator circuit 41 of the second embodiment is used to compare a signal outputted from such a sensor, the sensor signal can be compared without dropping a voltage of the sensor signal by voltage division with resistors.

In the first embodiment, the buffer 33 has to be installed only when necessary. The structure to give the comparator circuit a hysteresis characteristic has to be provided only when necessary.

In the second embodiment, the resistance element connected to the sources of the FETs 25 and 29 may be three or more elements. The resistance element bypassed by the FETs 34 and 48 may be two or more elements.

This comparator can be applied to any comparator circuit as long as it is constructed with a comparison operation unit whose power supply for operation provides a lower voltage than the maximum of the input voltage.

What is claimed is:

1. A comparator circuit constructed with MOSFETs of a LOCOS-drain structure formed on a P-type silicon substrate, the comparator circuit comprising:
    a first P-channel MOSFET of the LOCOS-drain structure having a source connected to a first power supply, which supplies a first supply voltage, through a first resistance element and a gate to which a reference voltage is applied;
    a second P-channel MOSFET of the LOCOS-drain structure having a source connected to the first power supply through a second resistance element and a gate to which an input signal voltage is applied;
    a current mirror circuit connected between drains of the first and the second P-channel MOSFETs and a ground;
    a comparison operation unit having a reference voltage input terminal and a comparison voltage input terminal, which are connected to the drains of the first and the second P-channel MOSFETs, respectively, and comparing the input signal voltage and the reference voltage, with power being provided from a second power supply, which supplies a second supply voltage lower than the first supply voltage of the first power supply; and
    voltage clamping means, disposed on a reference voltage input terminal side of the comparison operation unit, for performing a clamp operation when a potential of the terminal tends to rise above a predetermined level.

2. The comparator circuit according to claim 1, further comprising:
    reference voltage varying means including a series resistor circuit composed of a plurality of resistance elements connected in series, and connected between the first power supply and the ground,
    wherein the gate of the first P-channel MOSFET is connected to any of common junction points in the series resistor circuit, and that varies the reference voltage in response to a variation in a level of a signal outputted by the comparison operation unit by bypassing a resistance element connected closer to the ground than a reference voltage setting point of the series resistor circuit.

3. The comparator circuit according to claim 2, wherein the reference voltage varying means includes a MOSFET of the LOCOS-drain structure to bypass the resistance element.

4. The comparator circuit according to claim 1, further comprising:
    a plurality of series resistance elements connected between the first power supply and the source of the first P-channel MOSFET;
    a second plurality of series resistance elements having a resistance value equal to a resistance value of the plurality of series resistance elements and arranged between the first power supply and the source of the second P-channel MOSFET; and
    threshold varying means for varying a threshold voltage in the comparison operation unit in response to a variation in a level of an signal of the comparison operation unit by bypassing one or more of the series resistance elements connected to a source side of the first P-channel MOSFET, providing an alternative path to a first power supply side,
    wherein the reference voltage is applied directly from the outside.

5. The comparator circuit according to claim 4, wherein the threshold voltage varying means includes:
    a MOSFET of the LOCOS-drain structure having a gate connected to an output terminal of the comparison operation unit;
    a plurality of resistance elements connected in series with the MOSFET between the first power supply and the ground; and
    a P-channel MOSFET having a gate connected to any of common junction points in the plurality of resistance elements, a source connected to the first power source and a drain connected to a resistance element that is to be bypassed.

6. The comparator circuit according to claim 1, wherein the voltage clamping means includes an N-channel MOSFET, which has a drain and a gate connected to the reference voltage input terminal and has a source connected to the comparison voltage input terminal.

* * * * *